(12) United States Patent
Abe et al.

(10) Patent No.: US 7,028,397 B2
(45) Date of Patent: Apr. 18, 2006

(54) METHOD OF ATTACHING A SEMICONDUCTOR CHIP TO A CHIP MOUNTING SUBSTRATE

(75) Inventors: Shunichi Abe, Tokyo (JP); Tetsuya Uebayashi, Tokyo (JP); Naoki Izumi, Tokyo (JP); Akira Yamazaki, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 519 days.

(21) Appl. No.: 10/159,123

(22) Filed: Jun. 3, 2002

(65) Prior Publication Data

US 2003/0059981 A1   Mar. 27, 2003

(30) Foreign Application Priority Data

Sep. 25, 2001   (JP) .............................. 2001-290713

(51) Int. Cl.
*H05K 3/34* (2006.01)
(52) U.S. Cl. ............................. 29/840; 29/832; 29/827; 29/825; 156/521; 438/118
(58) Field of Classification Search .......... 29/739–740, 29/832, 827, 825, 564.1, 564; 156/521, 519, 156/559, 570, 265, 302; 414/737, 751; 438/111, 438/118, 123; 257/E21.505, E23.052
See application file for complete search history.

(56) References Cited

U.S. PATENT DOCUMENTS

| 5,188,982 | A | * | 2/1993 | Huang ...................... 228/123.1 |
| 5,765,277 | A | * | 6/1998 | Jin et al. ....................... 29/743 |
| 5,979,739 | A | * | 11/1999 | Jin et al. ....................... 228/6.2 |
| 6,620,651 | B1 | * | 9/2003 | He et al. ....................... 438/113 |
| 6,742,561 | B1 | * | 6/2004 | Nam et al. ................... 156/521 |
| 6,784,021 | B1 | * | 8/2004 | Abe et al. .................... 438/109 |
| 6,863,109 | B1 | * | 3/2005 | Kim et al. ................... 156/556 |
| 2003/0059981 | A1 | * | 3/2003 | Abe et al. .................... 438/118 |

FOREIGN PATENT DOCUMENTS

| JP | 57-090944 | 6/1982 |
| JP | 9-162206 | 6/1997 |
| JP | 11-204551 | 7/1999 |

* cited by examiner

*Primary Examiner*—Minh Trinh
(74) *Attorney, Agent, or Firm*—McDermott Will & Emery LLP

(57) ABSTRACT

A semiconductor chip, substrate employing plural bonding steps to ensure complete bonding particularly of peripheral edges. Embodiments include placing an adhesive layer on a chip mounting substrate positioned on a first supporting device, pressing a semiconductor chip against the chip mounting substrate to bond the semiconductor chip temporarily to the chip mounting substrate temporarily bonded chip on a second supporting device, and applying chip to straighten warpage and to bond the chip entirely to the chip mounting substrate.

5 Claims, 5 Drawing Sheets

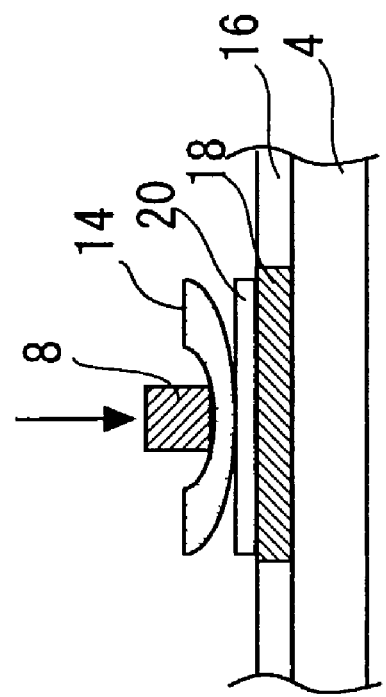
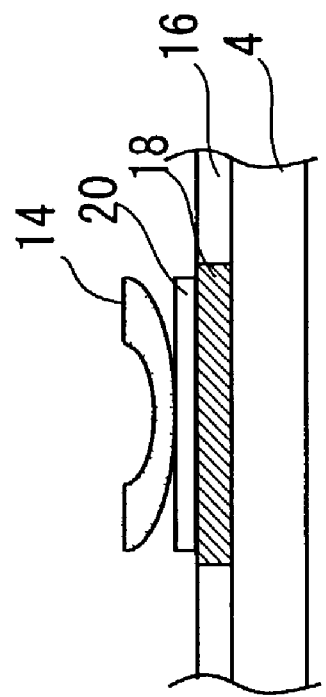
Fig.4A
Fig.4B

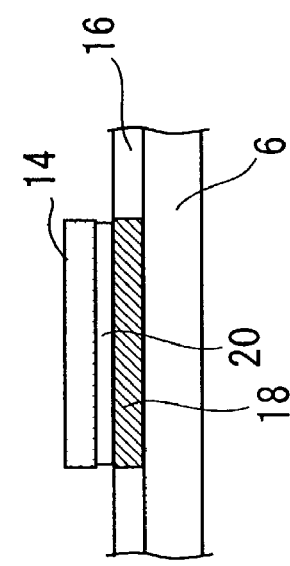
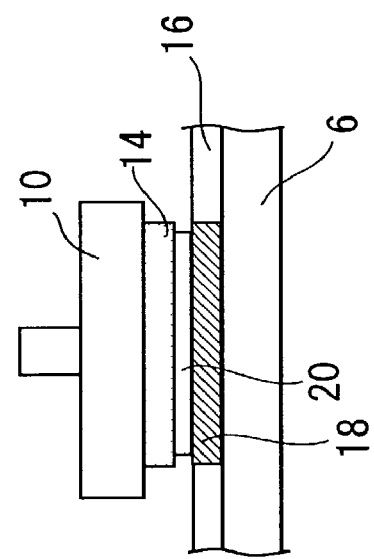
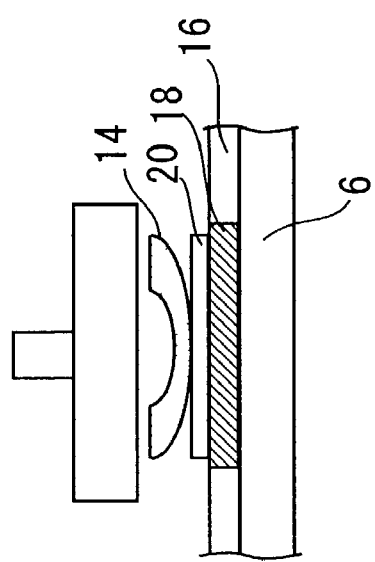

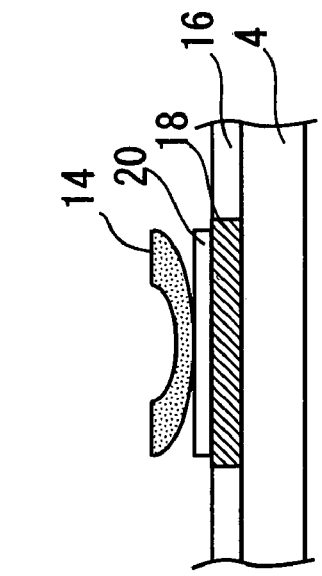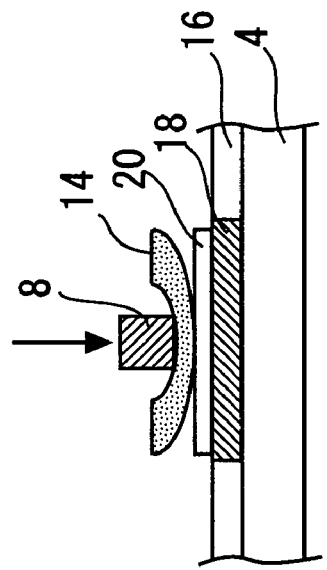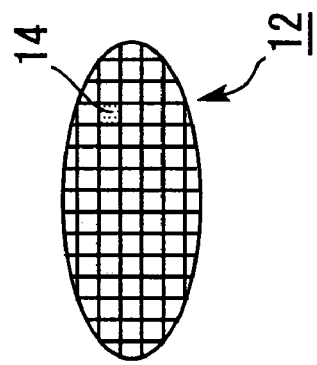

METHOD OF ATTACHING A SEMICONDUCTOR CHIP TO A CHIP MOUNTING SUBSTRATE

BACKGROUND OF THE INVENTION

1. Field of the Invention

The present invention relates to a semiconductor device, a method of producing the same, and semiconductor production equipment for carrying out the method. More specifically, the present invention relates to semiconductor production equipment for mounting a semiconductor chip on a die pad, and a method of operating the semiconductor production equipment.

2. Background Art

FIGS. 6A, 6B and 6C are views of assistance in explaining a conventional method of bonding a semiconductor chip to a substrate for supporting the semiconductor chip. As shown in FIG. 6A, in a semiconductor wafer 12, a plurality of semiconductor chips 14 are formed. The semiconductor wafer 12 is diced into a plurality of semiconductor chips 14. A collet 8 picks up one of the semiconductor chips 14 and carries the same to a die bonding apparatus, i.e., semiconductor production equipment.

As shown in FIG. 6B, a lead frame 16 provided with a die pad 18 in its central part is mounted on a heating block 4, i.e., a hot stage, of the die bonding apparatus. An adhesive layer 20 for bonding the semiconductor chip 14 to the die pad 18 is placed on the die pad 18. The collet 8 presses the semiconductor chip 14 lightly against the die pad 18 to bond the semiconductor chip 14 to the die pad 18. Then, the heating block 4 heats the die pad 18, the adhesive layer 20 and the semiconductor chip 14 to enable the adhesive layer 20 to bond the semiconductor chip 14 to the die pad 18.

SUMMARY OF THE INVENTION

Semiconductor devices have been progressively miniaturized and the thickness of semiconductor wafers has been reduced accordingly. Sometimes, the semiconductor chips formed by dicing the semiconductor wafer are warped by stress induced in surfaces thereof when circuits are formed thereon. The warped semiconductor chip 14 cannot be satisfactorily bonded to the die pad 18. When the collet 8 having the shape of a thin rod applies pressure to the semiconductor chip 14 to bond the semiconductor chip 14 to the die pad 18, the pressure is concentrated on the portion where the collet 8 presses the chip directly, i.e., a central part of the semiconductor chip 14 as shown in FIG. 6B. Consequently, a peripheral part of the semiconductor chip 14 that receives a comparatively low pressure remains warped and are not bonded securely to the die pad 18 as shown in FIG. 6C.

When the warped semiconductor chip 14 is bonded to the die pad 18 with its peripheral part spaced apart from the die pad 18 as shown in FIG. 6C, the semiconductor device formed thus incompletely bonding the semiconductor chip 14 to the die pad 18 is connected electrically incompletely to an external circuit. Therefore, it is an object of the present invention to provide an apparatus and method capable of securely bonding a semiconductor chip to a substrate.

According to one aspect of the present invention, a Semiconductor production equipment for attaching a semiconductor chip to a semiconductor chip mounting substrate, comprises a chip mounting unit for mounting the semiconductor chip on and pressing the same against the semiconductor chip mounting substrate to bond the semiconductor chip temporarily to the semiconductor chip mounting substrate, and a chip pressing unit for pressing the semiconductor chip temporarily bonded to the semiconductor chip mounting substrate against the semiconductor chip mounting substrate. The chip mounting unit includes a first supporting device for supporting the semiconductor chip mounting substrate and the semiconductor chip thereon, and a holding device capable of holding the semiconductor chip, of carrying the semiconductor chip and pressing the semiconductor chip against the semiconductor chip mounting substrate to bond the semiconductor chip temporarily to the semiconductor chip mounting substrate. The chip pressing unit includes a second supporting device for supporting the semiconductor chip mounting substrate to which the semiconductor chip is bonded thereon, and a pressing device for pressing the semiconductor chip against the semiconductor chip mounting substrate. Accordingly, the semiconductor chip can be entirely and surely bonded to the mounting substrate.

In another aspect of the present invention, in a semiconductor device producing method, a semiconductor chip mounting substrate provided with a predetermined adhesive layer is placed on a first supporting device included in a chip mounting unit and a semiconductor chip is mounted on the semiconductor chip mounting substrate in a chip mounting substrate feeding process. In a chip bonding process, a semiconductor chip is bonded temporarily to the semiconductor chip mounting substrate by pressing the semiconductor chip against the semiconductor chip mounting substrate. In a transfer process, the semiconductor chip mounting substrate is transferred to which the semiconductor chip is bonded temporarily by the chip bonding process from the first supporting device to a second supporting device. In a pressing process, the semiconductor chip is pressed firmly against the semiconductor chip mounting substrate to bond the semiconductor chip entirely to the semiconductor chip mounting substrate. Accordingly, the semiconductor chip can be entirely and surely bonded to the mounting substrate.

Other and further objects, features and advantages of the invention will appear more fully from the following description.

BRIEF DESCRIPTION OF THE DRAWINGS

FIGS. 3 to 5 are schematic views of assistance in explaining the die bonding method;

FIGS. 6A, 6B and 6C are views of assistance in explaining a conventional method of bonding a semiconductor chip to a substrate for supporting the semiconductor chip.

DETAILED DESCRIPTION OF THE PREFERRED EMBODIMENTS

Figure 1:
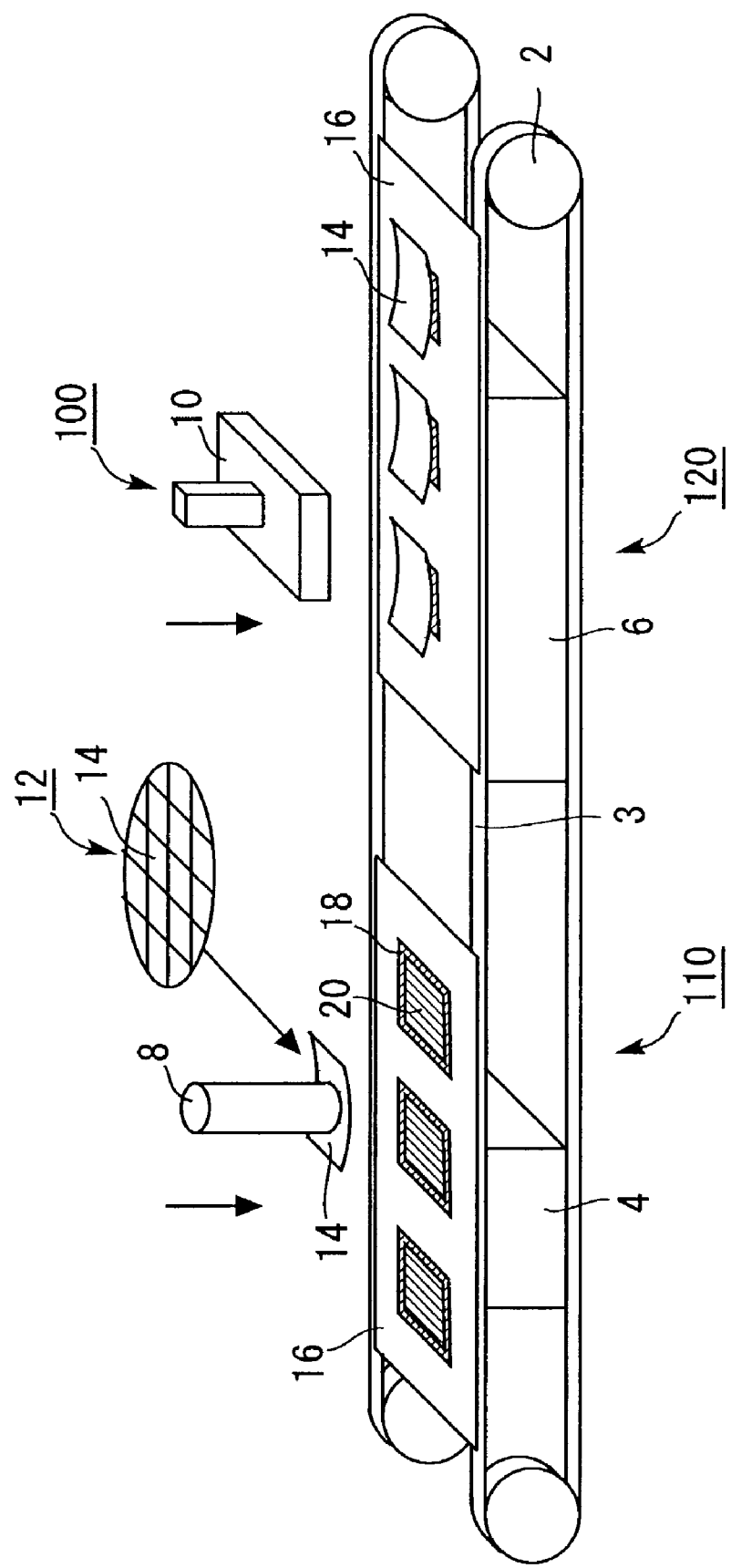
FIG. 1 is a schematic perspective view of a die bonding apparatus, i.e., semiconductor production equipment, for carrying out a semiconductor device producing method in a first embodiment according to the present invention.

Preferred embodiments of the present invention will be described with reference to the accompanying drawings, in which the same or like parts are denoted by the same reference characters and the duplicate description thereof will be omitted.

First Embodiment

FIG. 1 is a schematic perspective view of a die bonding apparatus 100, i.e., semiconductor production equipment, for carrying out a semiconductor device producing method in a first embodiment according to the present invention.

A plurality of semiconductor chips 14 are formed in a semiconductor wafer 12. Each of the semiconductor chips is formed by dicing a semiconductor wafer 12.

A lead frame 16 is a package for semiconductor devices. Die pad 18 is portion for mounting a semiconductor chip. The lead frame 16 is provided with the die pads 18. Adhesive layers 20 are attached to the die pads 18. The Adhesive layers 20 are used for bonding the semiconductor chips 14 to the die pads 18, respectively.

A heating block 4 is a portion on which the semiconductor chips 14 and the die pads 18 are placed when the semiconductor chip 14 is bonded to the die pad 18. The heating block 4 is internally provided with a cartridge heater, not shown. The heating block 4 heats the lead frame 16 and the semiconductor chip 14 mounted thereon to bond the semiconductor chip 14 to the die pad 18 of the lead frame 16.

A collet 8 picks up one of the semiconductor chips 14 formed by dicing the semiconductor wafer 12 and carries the same onto the heating block 4. The collet 8 presses the semiconductor chip 14 lightly against the die pad 18 to bond the semiconductor chip 14 to the die pad 18.

A chip mounting unit 110 of the die bonding apparatus 100 comprises the heating block 4 and the collet 8. The chip mounting unit 110 is a portion for pressing the semiconductor chip 14 against the die pad 18 of the lead frame 16 to bond the semiconductor chip 14 to the die pad 18.

The heating block is a portion on which the die pad 18 and the semiconductor chip 14 bonded to the die pad 18 by the chip mounting unit 110 is placed. Rubber rings 3 are extended between rotating pulley 2 such that the upper and under sides thereof extend past the heating blocks 4 and 6 as shown in FIG. 1. The rubber rings 3 are moved by rotating the pulley 2 to transfer the lead frame 16 from the heating block 4 to the heating block 6. The heating block 6 is internally provided with a cartridge heater, not shown, to heat the lead frame 16 and the semiconductor chip 14 when pressure is applied to the semiconductor chip 14.

A heating tool 10 applies heat and pressure to the semiconductor chip 14. The heating tool 10 has a surface area greater than that of the semiconductor chip 14 to apply pressure all over the semiconductor chip 14 at a time. The heating tool 10 presses the semiconductor chip 14 so that the entire contact surface of the semiconductor chip 14 including that of a warped peripheral part of the semiconductor chip 14 is bonded to the die pad 18. The heating tool 10 is internally provided with a cartridge heater, not shown, to apply both pressure and heat to the semiconductor chip 14.

A chip pressing unit 120 of the die bonding apparatus 100 comprises the heating block 6 and the heating tool 10. The chip pressing unit 120 straightens a warped peripheral part, which cannot be satisfactorily bonded to the die pad 18, of the semiconductor chip, so that the semiconductor chip 14 can be entirely bonded to the die pad 18. The die bonding apparatus 100 comprises the chip mounting unit 110 and the chip pressing unit 120.

Figure 2:
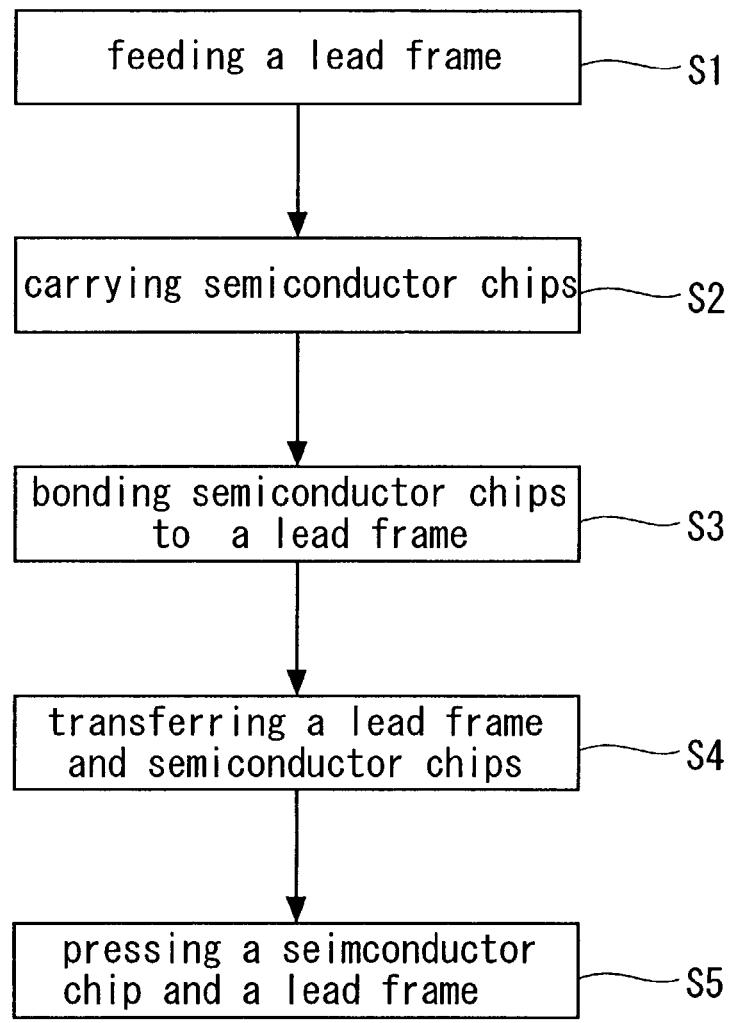
FIG. 2 is a flow chart of the die bonding method in the first embodiment according to the present invention.
Figure 3:
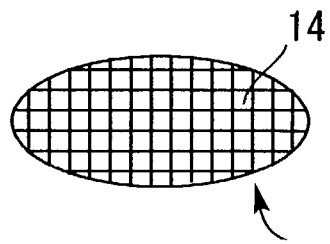

A die-bonding method of bonding the semiconductor chip 14 to the die pad 14 by the die bonding apparatus 100 will be described. FIG. 2 is a flow chart of the die bonding method, and FIGS. 3 to 5 are schematic views of assistance in explaining the die bonding method.

Referring to FIG. 2, a lead frame 16 is fed to the die bonding apparatus 100 in step S1. Adhesive layers 20 are formed on die pads 18, on which semiconductor chips 14 are mounted, of the lead frame 16. The lead frame 16 is moved onto the heating block 4 of the chip mounting unit 110 of the die bonding apparatus 100.

In step S2, semiconductor chips 14 are carried. A semiconductor wafer 12 is divided into a plurality of semiconductor chips 14 by dicing as shown in FIG. 3. The collet 8 picks up the semiconductor chip 14 and carries the same onto the die pad 18 of the lead frame 16, located on the heating block 4.

Then, in step S3, the semiconductor chip 14 is bonded to the die pad 18. The collet 8 presses the semiconductor chip 14 carried onto the die pad 18 in step S2 lightly against the die pad 18 as shown in FIG. 4A. At this time, the heating block 4 heated by the cartridge heater heats the adhesive layer 20 to bond the semiconductor chip 14 to the die pad 18.

Sometimes, a peripheral part of the semiconductor chip 14 is warped by stress induced in a surface provided with a circuit of the semiconductor chip 14 because the semiconductor wafer 12 is thin, and the collet 8 having the shape of a thin rod applies pressure to a central part of the semiconductor chip 14 in step S3. Therefore, only the central part of the semiconductor chip 14 is bonded to the die pad 18 and a peripheral part of the semiconductor chip 14 remains warping away from the die pad 18 as shown in FIG. 4B.

Then, in step s4, the lead frame 16 supporting the semiconductor chips 14 each having only the central part bonded to the die pad 18 is transferred from the chip mounting unit 110 to the heating block 6 of the chip pressing unit 120. Since the rubber rings 3 are extended past the heating block 4 of the chip mounting unit 110 and the heating block 6 of the chip pressing unit 120, the rotating Pulley 2 are rotated to move the rubber rings 3 so as to carry the lead frame 16 from the chip mounting unit 110 to the chip pressing unit 120.

A pressing operation is executed in step S5. As shown in FIGS. 5A and 5B, the heating tool 10 applies pressure to the semiconductor chip 14 temporarily bonded to the die pad 18 of the lead frame 16 placed on the heating block 6 to depress the semiconductor chip 14 entirely. At the same time, the heating block 6 and the heating tool 10 heated by the cartridge heaters apply heat through the semiconductor chip 14 and the die pad 18 to the adhesive layer 20 to bond the semiconductor chip 14 securely to the die pad 18. Consequently, the warped semiconductor chip 14 is straightened and the semiconductor chip 14 can be bonded properly to the die pad 18 as shown in FIG. 5C.

In this embodiment, the semiconductor chip 14 is temporarily bonded to the die pad 18, the warped peripheral part of semiconductor chip 14 is straightened, and then the semiconductor chip 14 is bonded to the die pad 18. Thus, the semiconductor chip 14 including a warped peripheral part of the semiconductor chip 14 can be surely entirely bonded to the die pad 18.

In this specification, a chip mounting substrate thereon is a substrate which supports a semiconductor chip thereon in a semiconductor device, and different types of packages of semiconductor devices use different chip mounting substrates, respectively. In this embodiment, the package is the lead frame 16 and hence the die pad 18 is the chip mounting substrate. However, packages and chip mounting substrates other than the lead frame 16 and the die pad 18 may be employed.

A holding device in the present invention is, for example, the collet 8 employed in this embodiment. The holding device may be any device other than the collet 8, provided that the device is capable of carrying a semiconductor chip and placing the same on a mounting member.

A first supporting device of a chip mounting unit and a second supporting device of a chip pressing unit according to the present invention correspond to, for example, the heating block 4 and the heating block 6, respectively, of the die bonding apparatus in this embodiment. The respective supporting devices of the chip mounting unit and the chip pressing unit are not limited thereto and may be any devices capable of supporting the semiconductor chip and the mounting substrate thereon when bonding the semiconductor chip to the mounting substrate.

The heating blocks 4 and 6 are interconnected by the rubber rings 3 which carry the lead frame 16 having the die pads 18 to which the semiconductor chips 14 are bonded in the chip mounting unit 110. The chip mounting unit 110 and the chip pressing unit 120 may be completely separate units, and the lead frame 16 may be held and transferred from the heating block 4 to the heating block 6 by a carrying mechanism capable of gripping the lead frame 16.

Heating devices according to the present invention, for example, correspond to the cartridge heaters incorporated into the heating blocks 4 and 6. The heating devices are not limited to the cartridge heaters and may be any suitable heating devices capable of heating the heating blocks 4 and 6. Although both the heating blocks 4 and 6 are provided with the heating devices in this embodiment, heating blocks not provided with any heating devices may be used.

A pressing device according to the present invention is, for example, the heating tool 10 in this embodiment. The surface area of the heating tool 10 in this embodiment is greater than that of the semiconductor chip to straighten the warped peripheral part of the semiconductor chip by a single pressing operation. The pressing device does not necessarily need to be formed in such a shape and may be formed in any suitable shape provided that the pressing device is capable of straightening a warped peripheral part of a semiconductor chip.

The die bonding apparatus 100 used by this embodiment is provided with the single heating tool 10. The die bonding apparatus 100 may be provided with a plurality of heating tools to straighten a plurality of warped semiconductor chips simultaneously.

A heating device of the chip pressing unit according to the present invention, for example, corresponds to the cartridge heater incorporated into the heating tool 10. However, the heating device of the chip pressing unit is not limited to the cartridge heater, and the heating tool 10 does not necessarily need to be provided with the heating device.

A mounting substrate feeding process according to the present invention is executed, for example, in step S1 of this embodiment. A chip bonding process according to the present invention is executed, for example, in steps S2 and S3. A workpiece transfer operation according to the present invention is executed, for example, in step s4. A pressing process according to the present invention is executed, for example, in step S5. A method according to the present invention is not limited to the foregoing method including steps S1 to S5.

Although the lead frame 16 having the die pads 18 respectively provided with the adhesive layers 20 is fed onto the heating block 4 in step S1 in this embodiment, step S1 is not limited thereto; the adhesive layers 20 may be formed on the die pads 18 after mounting the lead frame 16 on the heating block 4. An additional heating block may be disposed on the path of the rubber rings 3, the adhesive layers 20 may be formed on the die pads 18 on the additional heating block, and then the lead frame 16 may be carried to the heating block 4 by the rubber rings 3.

The feature and advantage of the present invention as described above may be summarized as follow.

According to the present invention, the semiconductor chip is mounted on and bonded temporarily to the mounting substrate, the warped part of the semiconductor chip is straightened, and then the semiconductor chip is bonded completely to the mounting substrate. Accordingly, the semiconductor chip can be entirely and surely bonded to the mounting substrate.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2001-290713, filed on Sep. 25, 2001 including specification, claims, drawings and summary, on which the Convention priority of the present application is based, are incorporated herein by reference in its entirety.

The invention claimed is:

1. A semiconductor device producing method comprising:
   a chip mounting substrate feeding process of placing a semiconductor chip mounting substrate provided with a predetermined adhesive layer on a first supporting device included in a chip mounting unit for mounting a semiconductor chip on the semiconductor chip mounting substrate;
   a chip bonding process of temporarily bonding the semiconductor chip to the semiconductor chip mounting substrate by pressing the semiconductor chip against the semiconductor chip mounting substrate;
   a transfer process of transferring the semiconductor chip mounting substrate to which the semiconductor chip is bonded temporarily by the chip bonding process from the first supporting device to a second supporting device; and
   a pressing process of pressing the semiconductor chip firmly against the semiconductor chip mounting substrate to bond the semiconductor chip entirely to the semiconductor chip mounting substrate.

2. The semiconductor device producing method according to claim 1, wherein the pressing process heats the semiconductor chip.

3. The semiconductor device producing method according to claim 1, wherein, in the pressing process, the semiconductor chip is pressed by a heating tool having a pressing surface area greater than that of the semiconductor chip.

4. A semiconductor device producing method comprising steps of:
   placing a semiconductor chip mounting substrate provided with a predetermined adhesive layer on a first supporting device;
   bonding a semiconductor chip to the semiconductor chip mounting substrate by pressing the semiconductor chip against the adhesive layer using a first pressing tool;
   after the bonding step, transferring the semiconductor chip mounting substrate to which the semiconductor chip is bonded by the chip bonding process from the first supporting device to a second supporting device; and
   after the transferring step, pressing the semiconductor chip against the adhesive layer using a second pressing tool, wherein
   pressed area on the semiconductor chip by the second pressing tool is greater than that by the first pressing tool.

5. The semiconductor device producing method according to claim 4, wherein, in the pressing step by the second pressing tool, heats the semiconductor chip via the second pressing tool.

* * * * *